United States Patent [19]

Itoo et al.

[11] Patent Number: 5,436,114
[45] Date of Patent: Jul. 25, 1995

[54] METHOD OF OPTICAL LITHOGRAPHY WITH SUPER RESOLUTION AND PROJECTION PRINTING APPARATUS

[75] Inventors: Masaru Itoo, Mitsukaido; Masumi Fujita, Toride, both of Japan

[73] Assignees: Hitachi, Ltd., Tokyo; Hitachi Maxell, Ltd., Osaka, both of Japan

[21] Appl. No.: 13,673

[22] Filed: Feb. 3, 1993

Related U.S. Application Data

[63] Continuation of Ser. No. 622,606, Dec. 5, 1990, abandoned, which is a continuation-in-part of Ser. No. 558,524, Jul. 27, 1990, abandoned.

[30] Foreign Application Priority Data

Dec. 6, 1989 [JP] Japan .................................. 1-315322

[51] Int. Cl.$^6$ ................................................ G03C 5/00
[52] U.S. Cl. .................................. 430/311; 250/492.1; 355/53; 355/71
[58] Field of Search .............. 430/311, 322, 327, 331; 250/492.1; 355/53, 71

[56] References Cited

U.S. PATENT DOCUMENTS

| | | | |
|---|---|---|---|
| 4,346,164 | 8/1982 | Tabarelli | 430/327 |
| 4,988,188 | 1/1991 | Ohta | 353/122 |
| 5,144,362 | 9/1992 | Kamon | 355/53 |
| 5,302,999 | 4/1994 | Oshida | 355/1 |
| 5,316,896 | 5/1994 | Fukuda | 430/322 |
| 5,323,208 | 6/1994 | Fukuda | 355/53 |

FOREIGN PATENT DOCUMENTS

| | | | |
|---|---|---|---|
| 89131741 | 5/1989 | European Pat. Off. | 430/327 |
| 2539690 | 3/1976 | Germany | 430/327 |
| 63-114127 | 5/1988 | Japan | 430/327 |

OTHER PUBLICATIONS

Nikkei Microdevice for Feb. 1987, pp. 103–124, Drawings only.
Hitachi Technical Review vol. 71, No. 5 (May 1989) pp. 25–32, Drawings only.

*Primary Examiner*—Kathleen Duda
*Attorney, Agent, or Firm*—Antonelli, Terry, Stout & Kraus

[57] ABSTRACT

It is possible to improve the resolution of a formed pattern by utilizing anti-dissolution surface treatment of a photoresist layer and super resolution of an optical system, thereby to print a finer pattern having a narrower width than that of the resolving power determined by the wavelength of light used and the numerical aperture of a projection optical system, and patterning in the order of submicron is made possible easily when applied to a printing technique in a manufacturing process of semiconductor integrated circuits.

26 Claims, 2 Drawing Sheets

F I G. IA
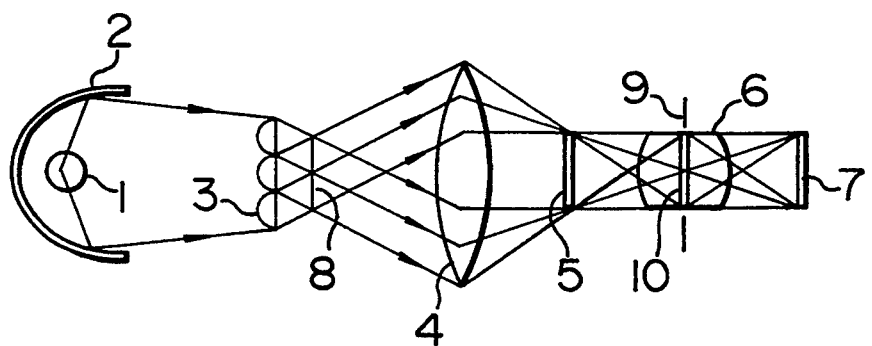
F I G. IB
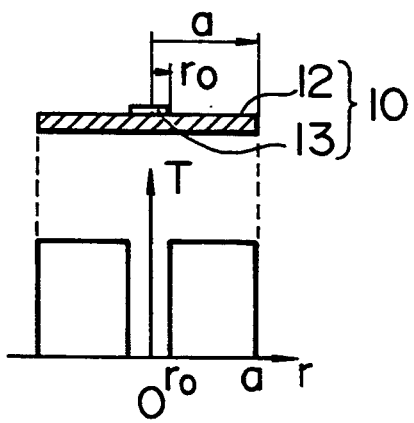
F I G. IC
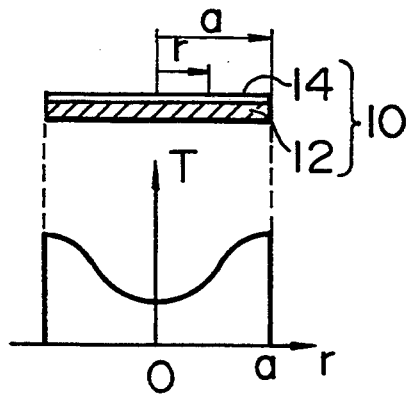
F I G. 2
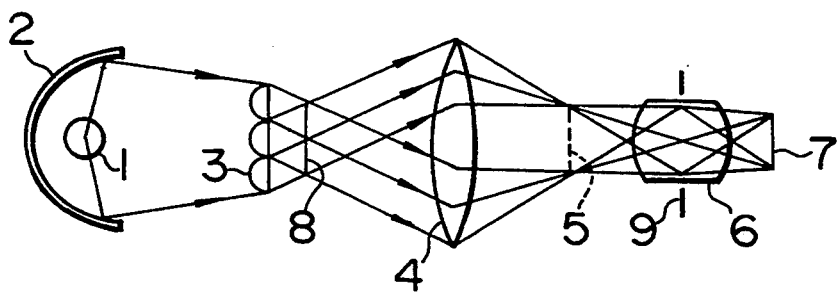

METHOD OF OPTICAL LITHOGRAPHY WITH SUPER RESOLUTION AND PROJECTION PRINTING APPARATUS

This application is a continuation of application Ser. No. 07/622,606, filed Dec. 5, 1990 now abandoned, which is a Continuation-In-Part application of Ser. No. 558,524 filed on Jul. 27, 1990, now abandoned the disclosure of which is hereby incorporated by reference.

BACKGROUND OF THE INVENTION

The present invention relates to a method of optical lithography and a projection printing apparatus.

The present invention is effective for forming a pattern with high resolution, and more particularly, is best suited for a printing technique in a manufacturing process of semiconductor integrated circuits of large scale integration (LSI) and very large scale integration (VLSI), etc.

Optical lithography has been widely used as a lithography technology for manufacturing semiconductor integrated circuits, for example, as disclosed in the "Nikkei Microdevice for February, 1987" pp. 103–124 and the "Hitachi Technical Review Vol. 71, No. 5 (1989-5)" pp. 25–32.

FIG. 2 shows an outline of a projection printing apparatus which is used for printing a circuit pattern onto a photosensitive layer on a wafer.

In FIG. 2, emitted light from a light source 1 is converged by a reflecting mirror 2, and then, applied to a fly's eye lens or lens array 3. An image 8 of a secondary light source is formed on a focal surface of the fly's eye lens 3. The secondary light source image is irradiated to a mask or reticle 5 on which a desired pattern consisting of a light transmitting portion and a light non-transmitting portion is formed by means of a condenser lens 4, and the image is formed on a pupil 9 of a projection optical system 6.

The projection optical system 6 projects the image of the reticle 5 onto a wafer 7, thereby to form a latent image corresponding to the mask image on a photosensitive layer on the wafer 7. In this case, the image formed by the condenser lens 4 of the secondary light source image 8 is formed to the full extent of the pupil 9 of the projection optical system, so that the image forming capability of the projection optical system 6 can be used sufficiently.

In the printing technique described above, a resolution of a reticle image projected on the wafer is determined by a numerical aperture NA of the projection optical system and a wavelength λ of a light source, and the resolution being almost in proportion to λ/NA when an illumination system such as the condenser lens 4 and the projection optical system 6 are aberration free.

The configuration of the pattern formed on a photosensitive layer on the wafer is also affected by a development process other than the printing process. In the case that the effect is expressed by a process parameter k, the resolution of the pattern becomes kλ/NA.

Hereupon, the value of k has been obtained approximately 0.7 at present, but, it is required that further improvement of both the resolving power of the projection optical system 6 and the process parameter k is necessary in the case that the pattern density is enhanced.

SUMMARY OF THE INVENTION

It is an object of the present invention to provide an optical lithography technique capable of forming finer patterns.

It is another object of the present invention to provide a projection printing apparatus capable of printing finer patterns, the width of which is narrower than the resolving power determined by the wavelength of light for use in the exposure and the numerical aperture of the projection optical system.

The resolution of the printed pattern can be improved by three methods; 1) the process parameter k is made smaller, 2) the exposure wavelength λ is made smaller, and 3) the numerical aperture NA of the projection optical system is made larger.

A multilayer resist is used and performance of a single layer resist is improved in order to obtain a small process parameter k indicated in 1).

Stepper or step and repeat type lithography with i-beam (365 nm) has been already developed with respect to the exposure wavelength λ indicated in 2), but the wavelength can be shortened further by using an excimer laser.

A projection lens for g-beam (436 nm) at NA=0.6 has been developed, and also, research and development have been extensively carried on so that a projection lens for g-beam (436 nm) at high NA has an exposure region of approximately 15 mm square which is practical as a semiconductor manufacturing equipment for mass production in the case of enhancement of NA indicated in 3).

Unlike three improvement measures stated in 1) thru 3), the present invention has features that the resolution of the formed patterns is improved by utilizing an anti-dissolution surface treatment of a photoresist film and super resolution of the optical system, thereby forming much finer patterns.

The anti-dissolution surface treatment means that, after soaking an unexposed photoresist film in the developer for a short period of time, washing with water and drying, then, an anti-dissolution layer having small solubility to the developer is formed on the surface of the resist film.

The super resolution means is a phenomenon in which the resolution determined by diffraction by means of a numerical aperture (NA) of a lens is raised by varying the amplitude or phase distribution of the light beam passing through the pupil of the lens.

The super resolution optical system can be achieved by using a combination of a lens with an optical filter for modulating the light passing through the pupil of the lens in amplitude and/or phase distribution. For example, an annular aperture filter for stopping the central portion of the pupil may be used as an optical filter for modulating the light in amplitude distribution. For another example, an optical filter having a glass plate on which a transparent dielectric thin film (such as a $SiO_2$ film) of a refractive index of n is mounted on it, may be used as an optical filter for modulating the light in phase distribution, the transparent dielectric thin film being of the thickness of $\lambda/2n$, where λ is the wavelength of the light used.

The present invention is the same as a method for making an optical disk master disclosed in U.S. application Ser. No. 558,524, now abandoned, and refiled as Ser. No. 08/273,627, pending which was applied previously by the present inventor in that the anti-dissolution surface treatment of a photoresist film and super resolution of an optical system are utilized.

In the present invention, a refining technique in which anti-dissolution surface treatment of a photoresist film and super resolution of an optical system are combined, is applied to optical lithography for a patterning process in a manufacturing process of semiconductor integrated circuits and the like.

According to one feature of the present invention, a latent image corresponding to a mask image is formed on a photoresist film by using anti-dissolution surface treatment and projecting an image of a mask or a reticle on which a desired pattern is formed onto the photoresist film by the projection optical system of super resolution.

A zero-th order diffracted image of a mask projected to the photoresist film by the projection optical system of super resolution, is refined finer than the resolving power determined by the numerical aperture of the projection optical system.

Further, the present invention has a feature in that, by using the high contrast development, a harmfully high order diffracted images produced with super resolution is maintained, the photoresist exposed portion by a zero-th order diffracted image is only dissolved, than a finer pattern having a narrower width than the resolving power determined by the wavelength of the light used and the numerical aperture of the projection optical system is formed.

In the refining technique according to the present invention in which anti-dissolution surface treatment of a photoresist film and super resolution image of an optical system are combined together, it is possible to achieve much finer pattern in combination with three improvement measures in 1) thru 3) described above. It is apparent that further refining is made possible when the exposure wavelength is made smaller by using an excimer laser as a light source for instance.

According to the present invention, it is possible to construct an optical system of super resolution by inserting an optical filter having an appropriate modulating portion into a pupil of a projection optical system, it is possible to form a finer pattern having a narrower width than the resolving power which is determined by the exposure wavelength and the numerical aperture of a projection optical system by combining the optical system of super resolution with anti-dissolution surface treatment of the photoresist film, and patterning in the order of submicron is also made possible easily by applying the present invention to a printing technique in a manufacturing process of semiconductor integrated circuits.

Still further advantages of the present invention will become apparent to those of ordinary skill in the art upon reading and understanding the following detailed description of the preferred embodiments.

BRIEF DESCRIPTION OF THE DRAWINGS

The invention will be described in conjunction with certain drawings which are for the purpose of illustrating the preferred embodiments of the invention only, and not for the purposes of limiting the same, and wherein:

FIG. 1A is a sectional view showing the outline of an optical system in a projection printing apparatus;

FIG. 1B shows an example of an optical filter used in the present embodiment and the transmission characteristic thereof;

FIG. 1C shows another example of an optical filter used in the present embodiment and the transmission characteristic thereof;

FIG. 2 is a sectional view showing the outline of a conventional projection printing apparatus;

DESCRIPTION OF THE PREFERRED EMBODIMENTS

Figure 3A:
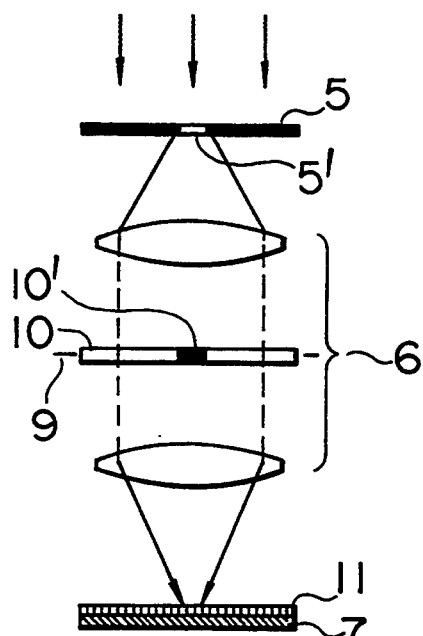
FIG. 3A is a schematic sectional view of an optical system.
Figure 3B:
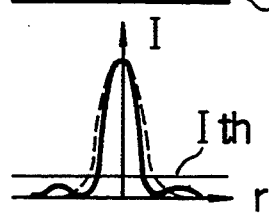
FIG. 3B shows intensity distribution of a diffracted image projected on a photoresist film.

First, the principle of the present invention will be described with reference to FIGS. 3A and 3B. FIG. 3A shows an outline of a projection optical system of a projection printing apparatus, and FIG. 3B shows the outline of light intensity distribution of a diffracted image which is projected on a wafer in the case when an optical filter is inserted in a pupil surface of the projection optical system by comparing with a case when no optical filer is provided. A reticle 5 is irradiated with illuminating light from an illumination system (not shown), and the image of the reticle 5 is projected onto a photoresist film 11 on a wafer 7 by means of a projection optical system 6. An optical filter 10 is provided on a pupil surface 9 of the projection optical system.

In order to simplify the description, it is assumed that the pattern formed on the reticle 5 includes a transparent portion 5' in a small circle form at the central portion thereof. An annular aperture filter having an opaque portion 10' in a small circle form at the central portion thereof is used for the optical filter 10. At this time, in the light intensity distribution of a diffracted image projected on a photoresist film 11, the width of intensity distribution of a zero-th diffracted image becomes narrow as shown with a solid line as compared with a case shown with a dotted line where there is no optical filter, but higher order diffracted images appear intensely on both sides of the zero-th diffracted image. This phenomenon is called super resolution, which is described in detail in "Wave Optics" written by Hiroshi Kubota (published by Iwanami Bookstore in 1971, pp. 175-177). Such a phenomenon is produced in a similar manner when phase modulation in which light amplitude distribution is not varied, but phase distribution is varied is employed, for example, when a transparent dielectric thin film which delays the phase by $\pi$ radian is employed in place of the opaque portion 10'.

However, it is impossible to incorporate this phenomenon as it is into the projection optical system of the projection printing apparatus. This is because of such a reason that the intensity distribution of higher order diffracted images appearing on both sides of the zero-th diffracted image by super resolution is too intense, and thus, latent images corresponding to higher order diffracted images are dissolved and applied with patterning in a conventional development processing.

According to the present invention, in order to prevent patterning by higher order diffracted images, the sensitivity of the photoresist surface, viz., dissolution characteristics for the developer are varied and the threshold of dissolution is raised so that latent images corresponding to higher order diffracted images are not dissolved, whereby to apply patterning to only the latent image corresponding to the zero-th diffracted image.

Development processing is made to show high contrast by using a photoresist film applied with anti-dissolution surface treatment so as to raise an effective gamma value of the photoresist film. In other words, the light intensity lth corresponding to the threshold is made higher as compared with the light intensity of higher order diffracted images. With this, only the latent image corresponding to the zero-th order diffracted image is dissolved by development as shown with a solid line in FIG. 3C. Thus, a pattern having a narrower width as compared with a case (shown with a dotted line) where there is no optical filter 10.

FIG. 1A shows an embodiment of the present invention.

FIG. 1A shows an outline of an optical system of a projection printing apparatus. The light emitted from a light source 1 is converged by a converging mirror 2, and is applied to a fly's eye lens 3. An image of a secondary light source is formed on a focal surface of the fly's eye lens 3. An arc lamp using mercury, xenon or the like is used for the light source 1. A parabolic mirror or an ellipsoidal mirror is used for the converging mirror 2. This secondary light source image is irradiated on the reticle 5 by a condenser lens 4, and the transmitted light is focused on a pupil 9 of the projection optical system 6. A desired circuit pattern has been drawn on the reticle 5 by means of an electronic beam drawing apparatus and the like.

The projection optical system 6 has the image on the reticle 5 projected on the wafer 7, and forms a latent image corresponding to the circuit pattern image which has been drawn on the reticle on the wafer 7 on which the photoresist film 11 is formed. The surface of the photoresist film 11 has been applied with anti-dissolution surface treatment. This anti-dissolution surface treatment will be described later.

In the present embodiment, the optical filter 10 is provided on the pupil 9 of the projection optical system 6. An optical filter in which a light non-transmitting portion 13 in a circular form is provided at the central portion of a transparent substrate 12 is used as the optical filter 10 as shown in FIG. 1B. For example, the optical filter 10 is manufactured by depositing a metallic film composed of chrome and the like at the central portion of a glass substrate by vapor deposition, sputtering and so forth.

When it is assumed that the diameter of the filter and the diameter of the light non-transmitting portion 13 at the center are $r_0$, the transmission factor distribution appears as shown with a curve in FIG. 1B. It is possible to produce a super resolution diffracted image on the photoresist film on the wafer by selecting the $r_0/a$ value appropriately.

In the present embodiment, the exposed portion of the photoresist is prevented from being developed by higher order diffracted images by the surface anti-dissolution layer of the photoresist. Therefore, patterning by higher order diffracted images cannot be prevented when the light intensity of the higher order diffracted images is too strong. Thus, an appropriate $r_0/a$ value is 0.1 to 0.5.

A composition such as shown in FIG. 1C is also effective for the optical filter 10. Namely, a filter in which an opaque film 14 such as a metallic film is formed on a transparent substrate 12 by controlling the film thickness distribution of the opaque film 14 so that the deeper concave portion is formed as going closer to the central portion as shown in FIG. 1C is used. The configuration of transmission factor distribution is determined so that an objective pattern size is obtainable including a development process.

Figure 4:
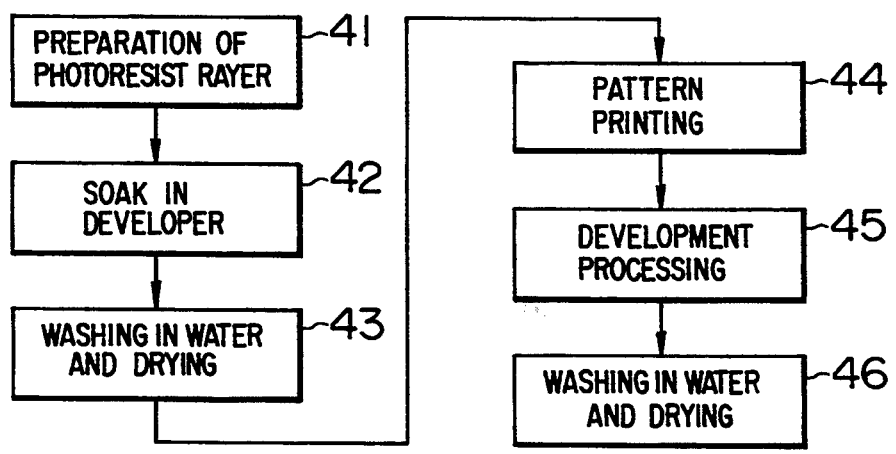
FIG. 4 is a schematic process diagram showing an embodiment of an optical/laser lithography method according to the present invention.

FIG. 4 is a diagram showing an example of an optical/laser lithography process according to the present invention, and shows the outline of exposure and development treatment process including anti-dissolution surface treatment of a photoresist film.

The optical/laser lithography method of the present embodiment is used in combination with the projection printing apparatus described with reference to FIG. 1A, FIG. 1B and FIG. 1C. First, the photoresist film 11 is applied and a prebaked wafer 7 is prepared (step 41). Positive type resist such as the AZ resist made by Hoechst Company is used for the photoresist. Prior to exposing the pattern, the wafer 7 applied with the photoresist film 11 is soaked in a developer, and anti-dissolution surface treatment is applied to the surface of the photoresist film 11 (step 42). The concentration of the developer and the development time are selected so that an anti-dissolution layer is formed on the photoresist film surface and noticeable film loss is not produced.

The mechanism of surface anti-dissolution using a developer is as follows. When an unexposed resist film is soaked in the developer, a base resin on the surface of the resist is first ionized by coming in contact with the developer, and dissolves into the developer.

At this time, a dissolution inhibitor in the resist also dissolves out, but it is the ionized base resin only that has hydrophilic properties. Therefore, only the ionized base resin dissolves out when washed in water.

On the other hand, the dissolution inhibitor having no hydrophilic properties, it does not dissolve out but remains on the surface. In such a manner, a layer in which the concentration of the dissolution inhibitor is increased comparatively higher than the concentration of the base resin is formed on the resist surface. Next, when the resist film is dried, the interface region thereof is fixed and an anti-dissolution layer having a small solubility to the developer is formed on the surface. Accordingly, the photoresist film 11 is washed in water and dried after being soaked in the developer under an unexposed state in order to apply anti-dissolution surface treatment in the present embodiment (step 43).

With this, an anti-dissolution layer in which cross link bonding of photoresist film molecules is not decomposed and development is difficult unless being subjected to sufficient exposure exceeding a certain threshold is formed on the surface of the photoresist film 11.

Next, this wafer 7 is set to the projection printing apparatus shown in FIG. 1, and an objective reticle pattern is projected onto the photoresist film (step 44). Development processing is performed after exposing the pattern (step 45). The development conditions such as the developer concentration, the development time and the liquid temperature are selected so that the portions which are exposed by higher order diffracted images are not dissolved.

Figure 3C:
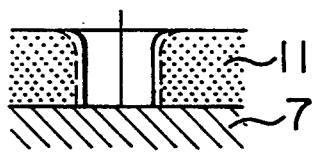
FIG. 3C is a sectional view of a pattern formed on a photoresist film.

The diffracted images projected on the photoresist film surface by the super resolution phenomenon are composed of a zero-th order diffracted image and higher order diffracted images as described with reference to FIG. 3A, FIG. 3B and FIG. 3C. As a result, latent images corresponding to those diffracted images, respectively, are produced in the photoresist film 11.

The latent images corresponding to higher order diffracted images are considerably intense latent images as compared with latent images in case no optical filter is provided. However, those latent images are not dissolved by development processing because of the existence of the anti-dissolution layer, but only the latent image 32 corresponding to the zero-th order diffracted image dissolves ultimately. Since the width of the light intensity distribution of the zero-th order diffracted image obtained by the super resolution phenomenon is small, a finer pattern having a narrower width than the resolving power determined by the exposure wavelength and the numerical aperture of the projection optical system can be obtained.

Next, washing in water and drying are performed to complete processing (step 46).

In the present embodiment, a case of a projection printing apparatus using an ordinary spectral light source has been described. However, the present invention is also applicable to a case in which a laser, e.g., an excimer laser is used as the light source, whereby making further refining possible.

The invention has been described with reference to the preferred embodiments. Obviously, modifications and alterations will occur to those of ordinary skill in the art upon reading and understanding the present invention. It is intended that the invention be construed as including all such modifications and alterations in so far they come with the scope of the appended claims or the equivalent thereof.

We claim:

1. A method of photolithography comprising the steps of:
    forming a photoresist layer having a surface on which an anti-dissolution layer against a developer is provided;
    projecting a desired pattern formed on a reticle onto said photoresist layer through a super resolution optical system so as to form a latent image corresponding to said pattern; and
    developing said photoresist layer;
    wherein said super resolution optical system enables a super resolution phenomenon so as to form a latent image composed of a zero-th order diffracted image and higher order diffracted images corresponding to said pattern on said photoresist layer; and
    in the step of developing said photoresist layer the latent image of said zero-the order diffracted image is dissolved so as to effect patterning of said zero-th order diffracted image; and
    wherein said super resolution optical system includes a projection lens which projects a desired pattern formed on said reticle onto said photoresist layer, and an optical filter which is disposed on a pupil of said projection lens and modulates a phase distribution of the light which is incident on said projection lens.

2. A method of photolithography according to claim 1, wherein said optical filter includes a circular stop having a smaller diameter than that of the light beam which is incident on said optical filter at the central portion thereof.

3. A method of photolithography according to claim 1, wherein said optical filter includes an opaque layer which is formed by controlling the layer thickness so that a transmission factor of the incident light becomes lower as approaching the central portion.

4. A method of photolithography according to claim 1, wherein said anti-dissolution film is formed by soaking said photoresist layer in a developer under an unexposed state and then washing in water and drying the same.

5. A method of photolithography according to claim 4, wherein said photoresist layer is formed on a surface of a wafer.

6. A method of photolithography according to claim 5, further comprising the step of drawing the desired circuit pattern on said reticle.

7. A method of photolithography according to claim 6, wherein said circuit pattern is drawn by an electronic beam drawing apparatus.

8. A method of photolithography according to claim 1, further comprising the step of irradiating the reticle on which the desired pattern is formed with light received from a light source, the super resolution optical system receiving the light which is transmitted through said reticle for projecting said pattern onto the photoresist layer.

9. A method of photolithography comprising the steps of:
    preparing a wafer having a photoresist layer applied with anti-dissolution treatment to a surface of said photoresist layer;
    projecting a desired circuit pattern onto said photoresist layer through a super resolution optical system thereby to form a latent image composed of a zero-th order diffracted image and higher order diffracted images corresponding to said circuit pattern on said photoresist layer; and
    developing said photoresist layer so as to effect patterning of said zero-th order diffracted image;
    wherein said super resolution optical system includes a projection lens which projects a desired pattern formed on said reticle onto said photoresist layer, and an optical filter which is disposed on a pupil of said projection lens and modulates a phase distribution of the light which is incident on said projection lens.

10. A method of photolithography according to claim 9, wherein said photoresist layer is soaked in a developer under an unexposed state, then washed in water and dried as said anti-dissolution treatment.

11. A method of photolithography according to claim 9, wherein said optical filter includes a circular stop having a smaller diameter than that of the light beam which is incident on said optical filter at the central portion thereof.

12. A method of photolithography according to claim 9, wherein said optical filter includes an opaque layer which is formed by controlling the layer thickness so that a transmission factor of the incident light becomes lower as approaching the central poriton.

13. A method of photolithography according to claim 9, wherein said circuit pattern is drawn by an electron beam drawing apparatus.

14. A method of pattern printing comprising the steps of:
    projecting and exposing a mask pattern onto a photoresist layer formed on a substrate by projecting light transmitted through the mask pattern and then through an optical projection lens onto the photoresist layer; and
    developing the photoresist layer;
    wherein the projection and exposure are effected through an optical filter which is disposed on a pupil of said optical projection lens and modulates at least one of a phase and amplitude distribution of the transmitted light.

15. A method according to claim 14, wherein the mask pattern is formed on a reticle which is irradiated by light from a light source of illuminating systems.

16. A method according to claim 14, wherein said optical filter modulates both the phase and amplitude distribution of the transmitted light.

17. A method according to claim 16, wherein said optical filter comprises an annular aperture filter having an opaque portion at the center thereof provided on a transparent substrate.

18. A method according to claim 17, wherein a ratio $r_o/a$ is 0.1 to 0.5, where a is a diameter of said filter and $r_o$ is a diameter of said opaque portion.

19. A method according to claim 14, wherein said optical filter modulates the phase distribution of the transmitted light.

20. A method according to claim 14, wherein the optical filter modulates the amplitude distribution of the transmitted light.

21. A method according to claim 14, wherein the substrate is a semiconductor wafer.

22. A method according to claim 14, wherein the optical filter is a transparent dielectric film.

23. A method according to claim 22, wherein the transparent dielectric film is a $SiO_2$ film.

24. A method according to claim 14, wherein the optical filter includes a portion which delays the phase by $\pi$ radian at a portion of the optical filter.

25. A method according to claim 14, wherein the optical filter enables a smaller amount of light transmission at a center portion thereof than at a peripheral portion thereof.

26. A method of pattern printing of a semiconductor wafer comprising the steps of:
projecting and exposing a mask pattern onto a photoresist layer formed on a semiconductor wafer by projecting light transmitted through the mask pattern and then through an optical projection lens onto the photoresist layer; and
developing the photoresist layer;
wherein the projection and exposure are effected through an optical filter which is disposed on a pupil of said optical projection lens and modulates at least one of a phase and amplitude distribution of the transmitted light.

* * * * *